(12) United States Patent
Noeske

(10) Patent No.: US 7,750,832 B2
(45) Date of Patent: Jul. 6, 2010

(54) CASCADED INTEGRATED COMB FILTER WITH FRACTIONAL INTEGRATION

(75) Inventor: Carsten Noeske, Sexau (DE)

(73) Assignee: Trident Microsystems (Far East) Ltd., Grand Cayman (KY)

( * ) Notice: Subject to any disclaimer, the term of this patent is extended or adjusted under 35 U.S.C. 154(b) by 6 days.

(21) Appl. No.: 12/239,318

(22) Filed: Sep. 26, 2008

(65) Prior Publication Data

US 2009/0079600 A1 Mar. 26, 2009

(30) Foreign Application Priority Data

Sep. 26, 2007 (DE) ........................ 10 2007 046 181

(51) Int. Cl.
*H03M 3/00* (2006.01)
(52) U.S. Cl. ....................................... 341/143; 341/155
(58) Field of Classification Search ................. 341/155, 341/143, 122; 375/350, 225; 364/724.01, 364/724.09; 708/313
See application file for complete search history.

(56) References Cited

U.S. PATENT DOCUMENTS

| 5,592,517 | A | * | 1/1997 | Camp et al. ................. 375/350 |
| 5,596,609 | A | * | 1/1997 | Genrich et al. .............. 375/350 |
| 6,518,894 | B2 | | 2/2003 | Freidhof |
| 7,170,959 | B1 | * | 1/2007 | Abbey ........................ 375/350 |
| 7,196,648 | B1 | | 3/2007 | Ding et al. |
| 2004/0148319 | A1 | | 7/2004 | Bossmeyer et al. |

FOREIGN PATENT DOCUMENTS

DE 19925464 1/2003

* cited by examiner

*Primary Examiner*—Peguy JeanPierre
(74) *Attorney, Agent, or Firm*—O'Shea Getz P.C.

(57) ABSTRACT

A cascaded integrator comb filter includes a first integrator that receives an input signal x[n] and provides an integrated signal, and a fractional integrator that also receives the input signal x[n] and provides a fractional integrated signal. A summer sums the integrated signal and the fractional integrated signal and provides a summed signal indicative thereof to a second integrator, which receives and integrates the summed signal to provide a second integrator output signal. A decimator unit receives the second integrator output signal and provides a decimated signal to a differentiator that receives the decimated signal and provides a differentiated signal.

18 Claims, 4 Drawing Sheets

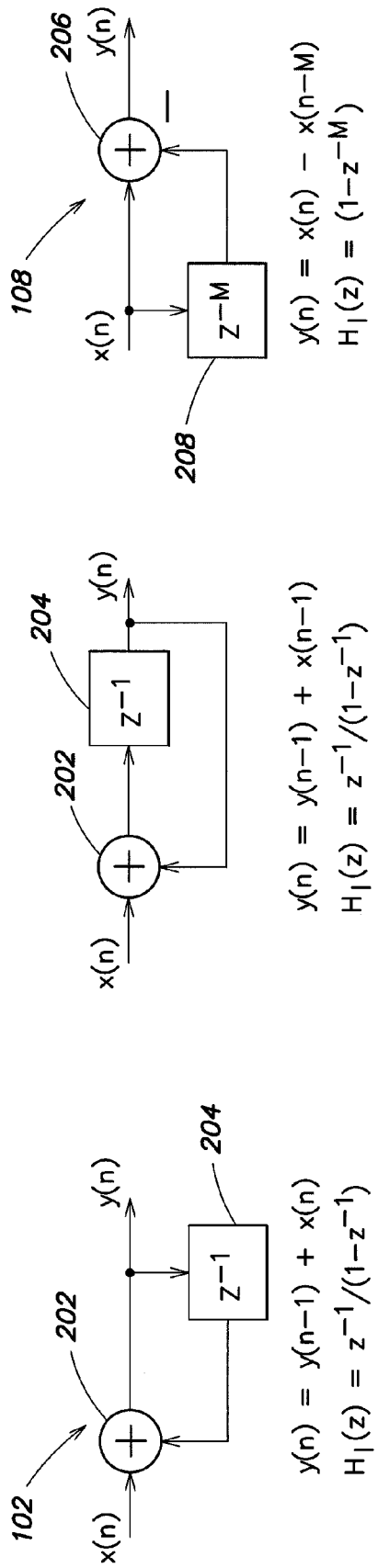
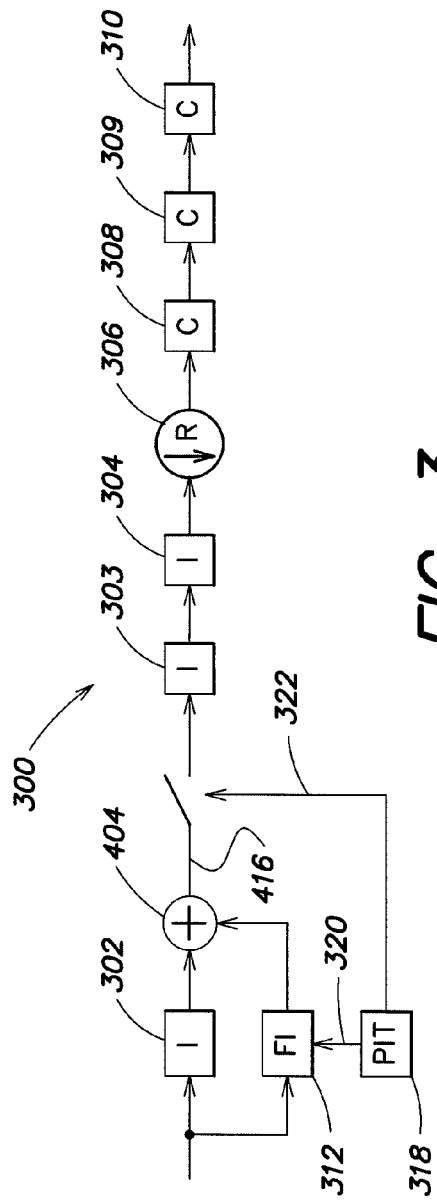

CASCADED INTEGRATED COMB FILTER WITH FRACTIONAL INTEGRATION

PRIORITY INFORMATION

This patent application claims priority from German patent application 10 2007 046 181.1 filed Sep. 26, 2007, which is hereby incorporated by reference.

BACKGROUND OF THE INVENTION

The invention relates to a cascaded integrated comb (CIC) filter.

CIC filters are also known as moving time average (MTA) filters. An example of where CIC filters are employed is for sampling rate reduction, for example, to reduce the bandwidth while simultaneously decreasing the sampling rate by a whole-number factor R. In the simplest case, a CIC filter for decimating an input-side signal clock speed comprises an accumulator, which sums R samples and outputs the result every R clock cycle, and whose contents are thereupon set to zero. This can be formally described as a series circuit of an integrator, a decimation stage and a differentiator, an input signal being supplied to the integrator and being made available, on the output side thereof, to the decimation stage. The decimation stage reduces the signal clock speed by a factor of R so that $f_{out}=f_{in}/R$, and supplies the reduced-clock-speed signal to the differentiator. The differentiator processes the reduced-clock-speed signal and makes it available on the output side. A higher-order CIC filter contains additional integrators on the input and additional differentiators on the output. A disadvantage of such CIC filters is that a clock speed reduction is possible only for whole-number values of R, that is, that every R-th input-side sample value is made available by the decimation stage on the output side.

For symbol clock speed controls in purely digital demodulators for communications systems, it is advantageous to implement sampling of the input-side signal at the proper symbol time points, for example, even in between two sample values. At this time, however, no signal values are available.

It is known from the prior art to obtain intermediate values by interpolation.

Fractional interpolation has been accomplished with polyphase FIR filters in which every polyphase approximates an all-pass filter, for example, a filter in which every n-th sample value of the impulse response of the net filter is employed. A control device always chooses the polyphase that corresponds to a desired phase offset of the signal at each output value. This method, however, has the disadvantage that the coefficients need a relatively high resolution in bits in order to achieve adequate damping. This high resolution necessitates large multipliers for filter implementation. A further disadvantage is that a plurality of such multipliers are needed for such a filter and the storage of coefficients is inconvenient.

More recently, use of interpolating FIR (IFIR) filters has increased in which the number of polyphases is reduced by using polynomials to interpolate the final interpolation coefficients between distinct polyphases. While this reduces the storage requirement for the coefficients, it increases the necessary computing power and complicates the control of the filter.

There is a need for a CIC filter such that a fractional decimation of the sampling rate is possible in a simple and an efficient fashion.

SUMMARY OF THE INVENTION

According to an aspect of the invention, a cascaded integrator comb (CIC) filter includes a first integrator that receives an input signal x[n] and provides an integrated signal, and a fractional integrator that also receives the input signal x[n] and provides a fractional integrated signal. A summer sums the integrated signal and the fractional integrated signal and provides a summed signal indicative thereof to a second integrator, which receives and integrates the summed signal to provide a second integrator output signal. A decimator unit receives the second integrator output signal and provides a decimated signal to a differentiator that receives the decimated signal and provides a differentiated signal.

The first integrator which integrates in a well-defined time interval, may be analyzed in analog fashion. Consequently, the result of the first integration can be enlarged by a fractional increment.

In one embodiment, the fractional integrator contains an interpolation circuit that receives a fractional time increment from a timer circuit. This allows the fractional integrator to integrate a signal waveform over the fractional time increment between two sample values. Thus, it is possible to append a fractional integration increment to the time-discrete integration of the first integrator.

The interpolation circuit may be fashioned as a circuit for constant interpolation by holding of the value ("sample and hold"). This makes it possible to approximate the signal waveform and perform fractional integration with just one additional multiplier in the signal path. This multiplier is supplied with the input sample as well as the output signal of the timer circuit. The fractional integration increment is the result of the multiplication and is added onto the last result of the discrete integrator.

In another embodiment, a sampler determines and samples the output-side signal of the parallel circuit at time points determined by the timer circuit and makes it available on the output-side. With such a sampler, which can also be implemented for example as a sample and hold circuit, the output values after fractional integration has been performed are made available at the proper symbol time points and supplied, for example, to a further integrator. Such a procedure is meaningful because the further integrators of the CIC filter may operate at a whole-number multiple of the sampling rate of the output signal, independently of the first integrator.

These and other objects, features and advantages of the present invention will become more apparent in light of the following detailed description.

BRIEF DESCRIPTION OF THE DRAWINGS

FIGS. 2A and 2B are block diagram illustrations of integrator embodiments used in the CIC filters illustrated in FIGS. 1A and 1B;

FIG. 2C is a block diagram illustration of a differentiator used in the CIC filters illustrated in FIGS. 1A and 1B;

FIG. 3 is a block diagram illustration of a CIC filter according to an aspect of the invention;

DETAILED DESCRIPTION OF THE INVENTION

Figure 1A:
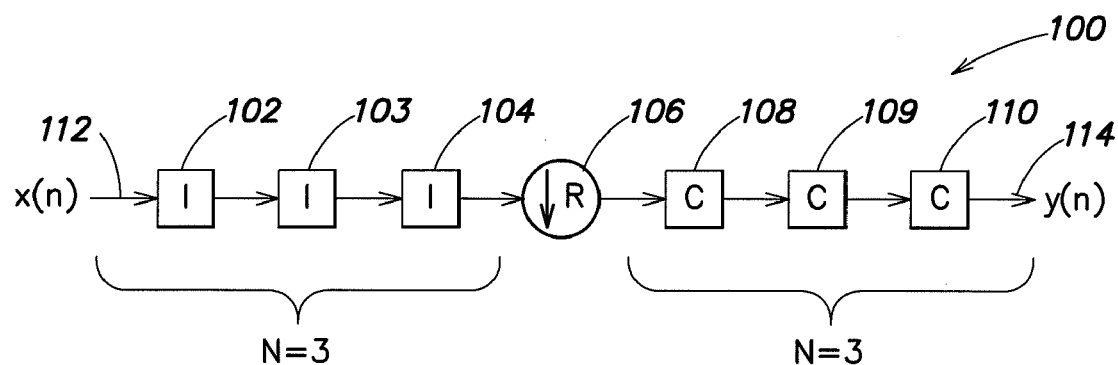
FIGS. 1A and 1B are block diagram illustrations of prior art CIC filters for decimating a symbol clock speed.
Figure 1B:
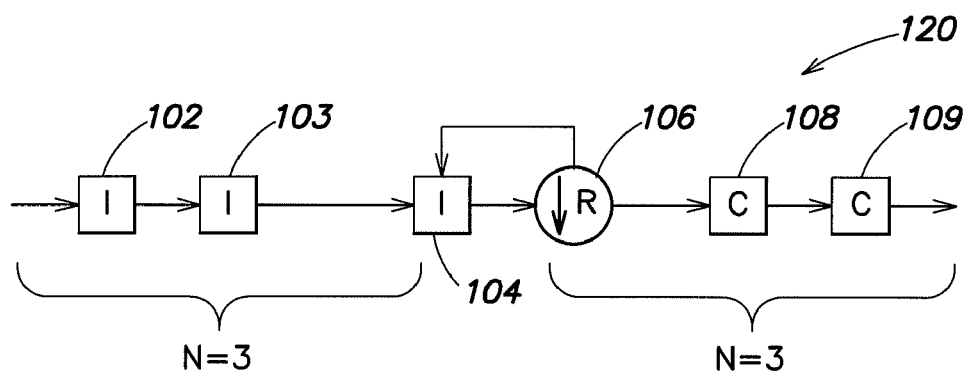

FIGS. 1A and 1B illustrate prior art CIC filters 100, 120 respectively. Such prior art CIC filters generally include a series circuit of N integrators (e.g., 102-104), a decimation stage 106 and N differentiators (e.g., 108-110). If desired, the inner combination of integrator, decimation stage and differentiator can be implemented as a resettable accumulator. Referring to FIG. 1A the CIC filter 100 for symbol clock speed decimation includes three integrators, a decimation stage and three differentiators. An input signal x[n] on a line 112 is integrated three times by the series-connected integrators 102-104 and supplied to the decimation stage 106. The output signal of the decimation stage 106 is supplied to the cascaded differentiators 108-110, and output as an output signal y[n] on line 114. This prior art CIC filter 100 with the decimation stage 106 has the disadvantage that only the input-side signal x[n], determined only from discrete sampling times, is available for decimation of the symbol clock speed. The decimation stage 106 can create a reduction of the symbol clock speed only by making, for example, every third sample value of the input signal x[n] available to the differentiator chain.

FIG. 2A illustrates the integrator 102 as used in the prior art CIC filter 100 according to FIGS. 1A and 1B. The discrete integrator 102 includes an analog adder 202 and a delay stage 204. The analog adder 202 is supplied with the input signal x[n] as well as output signal y[N−1] delayed by one symbol clock cycle, so that its function can be described by the formula $$y[n]=y[n-1]+x[N]$$

The transfer function $H_I(z)$ of the integrator 102 is accordingly $$H_I(z)=1:(1-z^{-1}).$$

Referring to FIG. 2B, the delay element 204 is positioned in the signal path, so that an advantage is achieved in terms of circuitry with regard to the path length in the circuit design. Accordingly, the transfer function of the integrator illustrated in FIG. 2B is $$H_I(z)=z^{-1}:(1-z^{-1}).$$

FIG. 2C illustrates an example of the discrete differentiator 108 that includes an analog adder 206 and a delay stage 208. The adder 206 receives the input signal x[n] and input signal x[n−M] delayed by M clock cycles, and provides an output signal y[n] having the function $$y[n]=x[n]-x[n-M].$$

The transfer function $H_c(z)$ of the differentiator 108, in reference to the clock speed of integrators, which is a factor of R greater than that of the differentiators, is $$H_C(z)=1-z^{-RM}.$$

In these formulas, M denotes the number of delay cycles and is as a rule 1 or 2, and R represents the decimation factor of the decimation stage.

FIG. 3 is a block diagram illustration of a CIC filter 300 according to an aspect of the invention having, for example, three integrators 302-304, a decimation stage 306 and, for example, three differentiators 308-310. The CIC filter 300 also includes a fractional integrator 312 connected in parallel with the first input-side integrator 302.

Figure 4:
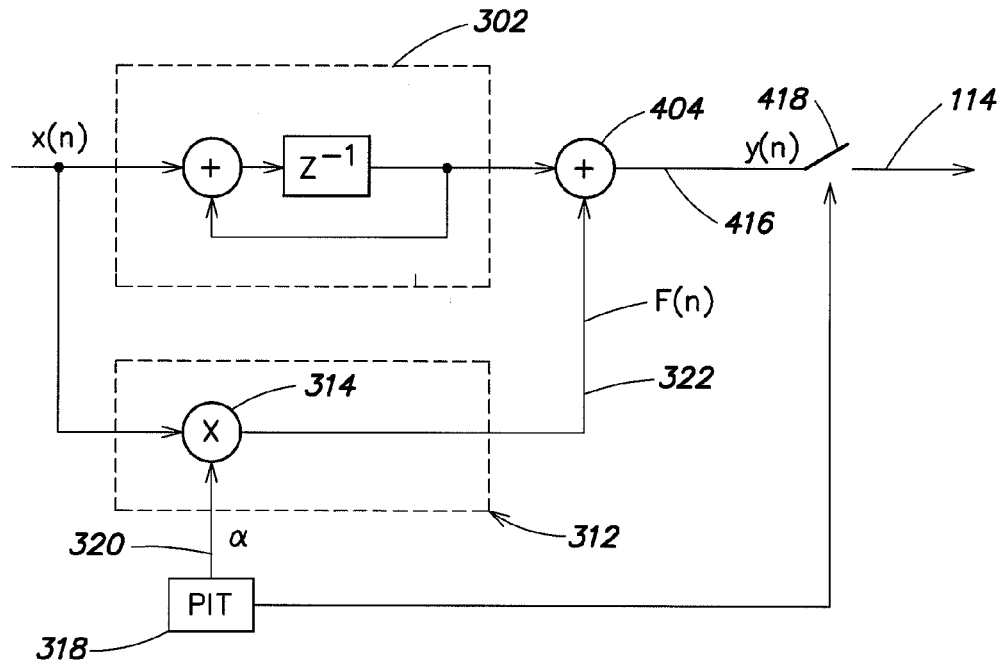
FIG. 4 is a block diagram illustration of the first integrator in the CIC filter in FIG. 3.

FIG. 4 illustrates a more detailed circuit block diagram of a first circuit portion of the CIC filter 300 illustrated in FIG. 3, namely the parallel circuit of the first integrator 302 and the fractional integrator 312. The input signal x[n] is supplied to the first integrator 302 and to the fractional integrator 312 connected in parallel. The fractional integrator 312 in this example is based on a sample and hold interpolation, such that it is built up from a multiplier 314. The multiplier 314 receives the input signal and a fractional time increment α on a line 320. A timer circuit 318 provides the fractional time increment α on a line 320, which represents the deviation of the desired sampling time from the symbol clock speed. Thus the multiplier 314 provides a fractional integration increment on a line 322 that corresponds, in a graphical presentation, to a rectangle having the height of the last signal value and having a width α. This fractional integration increment and the output signal of the first integrator 302 are summed by adder 404. This sum is made available on line 416 to the downstream integrator 303 (FIG. 3), for example through a sampler 418 controlled by the timer circuit 318. The sampler 418 advantageously does not forward to the downstream circuit parts all samples in which the timer circuit has separated a whole-number increment from the new fractional time increment α.

Figure 5:
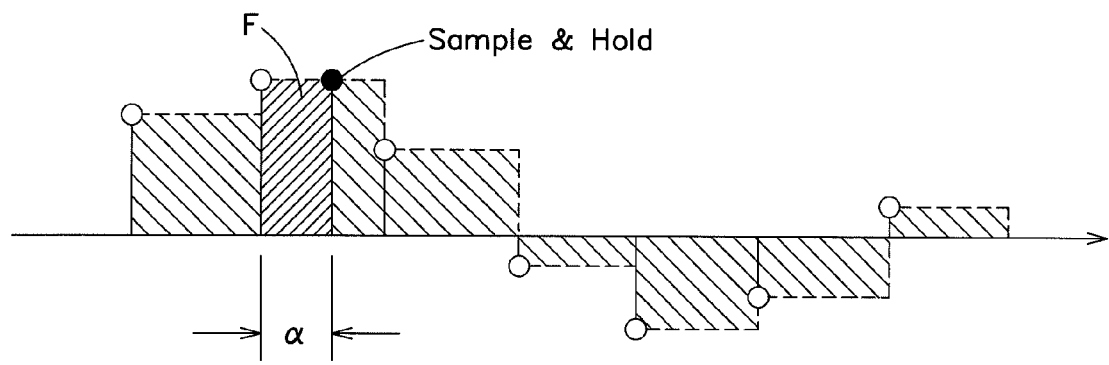
FIG. 5 is a plot of a signal sequence of the CIC filter of FIG. 3.

FIG. 5 illustrates an example of the output values y[n] of the integrator. If, for the decimation of the symbol clock speed, input-side signal x[n] is to be sampled at times when no discrete signal is present, no correct value for output signal y[n] of the integrator exists. In the present example, constant interpolation using a sample and hold (S&H) circuit is employed for calculating an interpolated intermediate value for the integral. In the graphical presentation, for a sampling time point n+α, a fractional increment F=x[n]·α, for example the shaded rectangle, is added to the last valid output value $_y$[n] of the integrator. This procedure generates a further valid output value for the integral, which depending on the interpolation method is a good approximation to the actual value of the integral at this time. Higher interpolation methods, for example linear interpolation, are also meaningful depending on the properties of the input signal.

Figure 6:
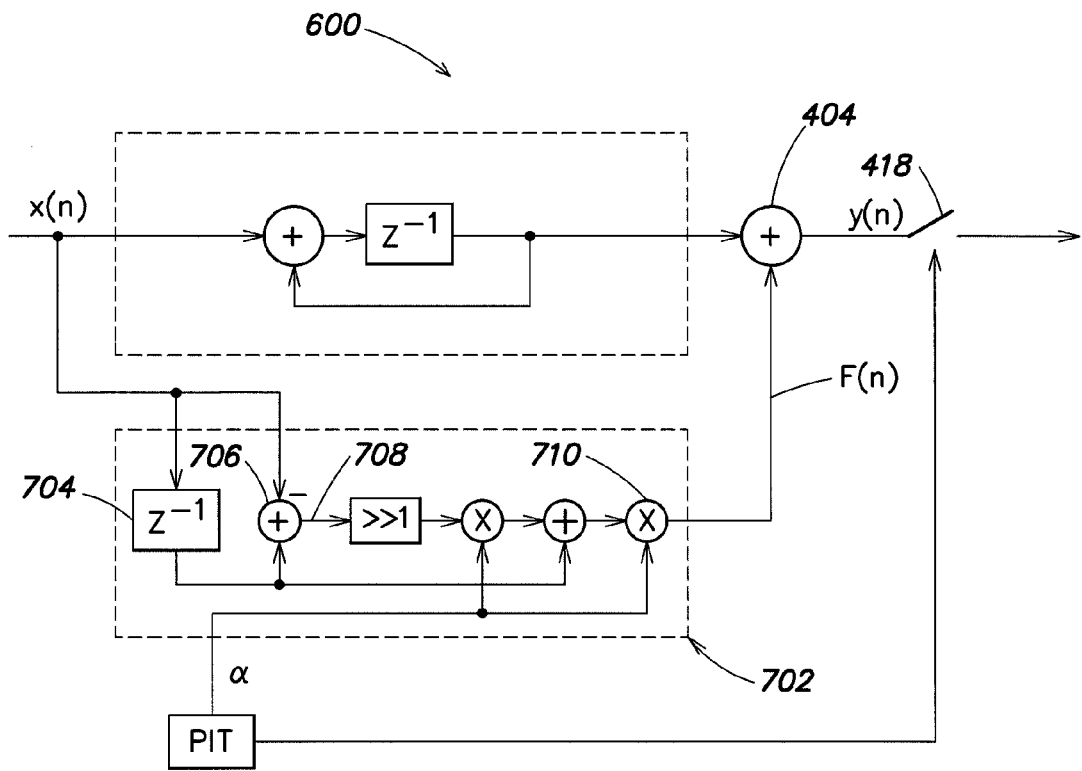
FIG. 6 is a block diagram illustration of an alternative embodiment CIC filter based on linear interpolation according to an aspect of the invention.

FIG. 6 illustrates an embodiment of a CIC fractional integration filter 600 based on linear interpolation. The embodiment of FIG. 6 is substantially the same as the embodiment of FIG. 4, with the principal exception that the fractional interpolator 702 is provided for linear interpolation. The input signal x[n] is provided to a delay stage 704 and to a difference unit 706 that provides a signal indicative of the difference between the delayed input signal x[n−1] and the input signal x[n]. The difference signal on line 708 is multiplied by the fractional time increment α and then added to the output signal of the delay stage 704. The sum is once more multiplied by the fractional time increment α by multiplier 710, and the product is output to the adder 404.

Figure 7:
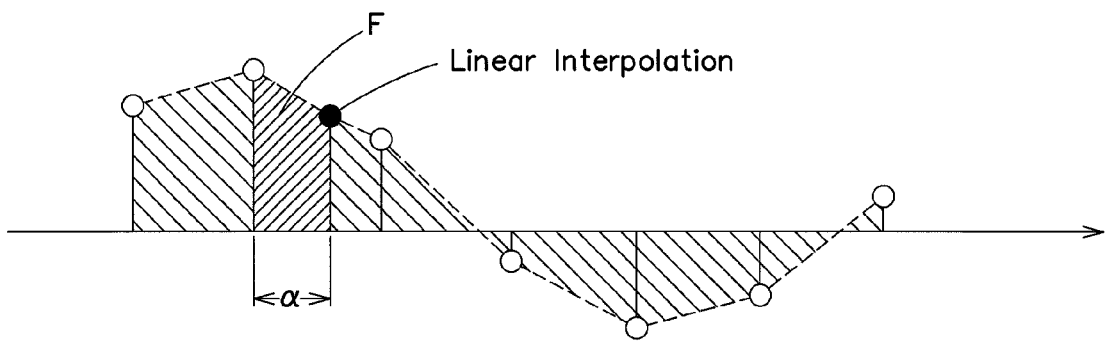
FIG. 7 is a plot of a signal sequence of the CIC filter of FIG. 6.

FIG. 7 illustrates the linear interpolation illustrated in FIG. 6 with reference to a sequence of sample values.

Although the present invention has been illustrated and described with respect to several preferred embodiments thereof, various changes, omissions and additions to the form and detail, may be made therein, without departing from the spirit and scope of the invention.

What is claimed is:

1. A cascaded integrator comb filter, comprising:
a first integrator that receives an input signal x[n] and provides an integrated signal;
a fractional integrator that receives the input signal x[n] and provides a fractional integrated signal;
a summer that sums the integrated signal and the fractional integrated signal and provides a summed signal indicative thereof;
a decimator unit that receives the summed signal and provides a decimated signal; and
a differentiator that receives the decimated signal and provides a differentiated signal.

2. The cascaded integrator comb filter of claim 1, where the decimator comprises a resettable accumulator.

3. The cascaded integrator comb filter of claim 1, further comprising a timer circuit that provides the fractional integrator with an output signal for calculating a fractional time increment ($\alpha$).

4. The cascaded integrator comb filter of claim 3, where the fractional integrator is configured to approximate the area under an interpolated signal between the input signal value and a second value.

5. The cascaded integrator comb filter of claim 4, where the second value is an interpolated value corresponding to the fractional time increment ($\alpha$).

6. The cascaded integrator comb filter of claim 3, further comprising a multiplier configured to receive the output signal from the timer circuit.

7. The cascaded integrator comb filter of claim 3, further comprising a sampler that samples the summed signal under the control of the timer circuit.

8. The cascaded integrator comb filter of claim 1, wherein the fractional integrator comprises a scaling circuit.

9. The cascaded integrator comb filter of claim 1, further comprising a second integrator serially coupled between the outputs of the first integrator and the fractional integrator and the decimator.

10. The cascaded integrator comb filter of claim 1, where the differentiator comprises a first differentiator and second differentiator connected in series.

11. A cascaded integrator comb filter, comprising:
a first integrator that receives an input signal x[n] and provides an integrated signal;
a fractional integrator that receives the input signal x[n] and provides a fractional integrated signal;
a summer that sums the integrated signal and the fractional integrated signal and provides a summed signal indicative thereof;
a second integrator that receives and integrates the summed signal to provide a second integrator output signal;
a decimator unit that receives the second integrator output signal and provides a decimated signal; and
a differentiator that receives the decimated signal and provides a differentiated signal.

12. The cascaded integrator comb filter of claim 11, where the differentiator comprises a first differentiator and a second differentiator connected in series, and the first differentiator receives the second integrator output signal and the second differentiator provides the differentiator signal.

13. The cascaded integrator comb filter of claim 12, further comprising a timer that provides a first control signal to the fractional integrator and a second control signal to a sample and hold unit that receives an output from the summer to generate the summed signal.

14. The cascaded integrator comb filter of claim 13, where the fractional integrator comprises a multiplier that multiplies the input signal with a control signal value to generate the fractional integrated signal.

15. The cascaded integrator comb filter of claim 13, where the fractional integrator comprises a linear interpolator.

16. A cascaded integrator comb filter, comprising:
a first integrator that receives an input signal x[n] and provides an integrated signal;
a fractional integrator that receives the input signal x[n] and provides a fractional integrated signal;
a summer that sums the integrated signal and the fractional integrated signal and provides a summed signal indicative thereof;
a sample and hold unit that receives the summed signal and provides a sample and hold output signal;
a second integrator that receives and integrates the sample and hold output signal, and provides a second integrator output signal;
a decimator unit that receives the second integrator output signal and provides a decimated signal; and
a differentiator that receives the decimated signal and provides a differentiated signal;
a timer unit that provides a integrator control signal to the fractional integrator and sample and hold control signal to the sample and hold unit.

17. The cascaded integrator comb filter of claim 16, where the fractional integrator comprises a multiplier that multiplies the input signal with a control signal value to generate the fractional integrated signal.

18. The cascaded integrator comb filter of claim 16, where the fractional integrator comprises a linear interpolator.

* * * * *